July 5, 1955 H. T. FAUS ET AL 2,712,563

THERMOELECTRIC ELEMENT

Filed April 23, 1952

Inventors:
Harold T. Faus
Donald E. Ridgley
by, Richard E. Hosley
Their Attorney United States Patent Office 2,712,563

Patented July 5, 1955

2,712,563

THERMOELECTRIC ELEMENT

Harold T. Faus, Lynn, and Donald E. Ridgley, Beverly, Mass., assignors to General Electric Company, a corporation of New York Application April 23, 1952, Serial No. 283,986

6 Claims. (Cl. 136—5)

Figures 1, 2:
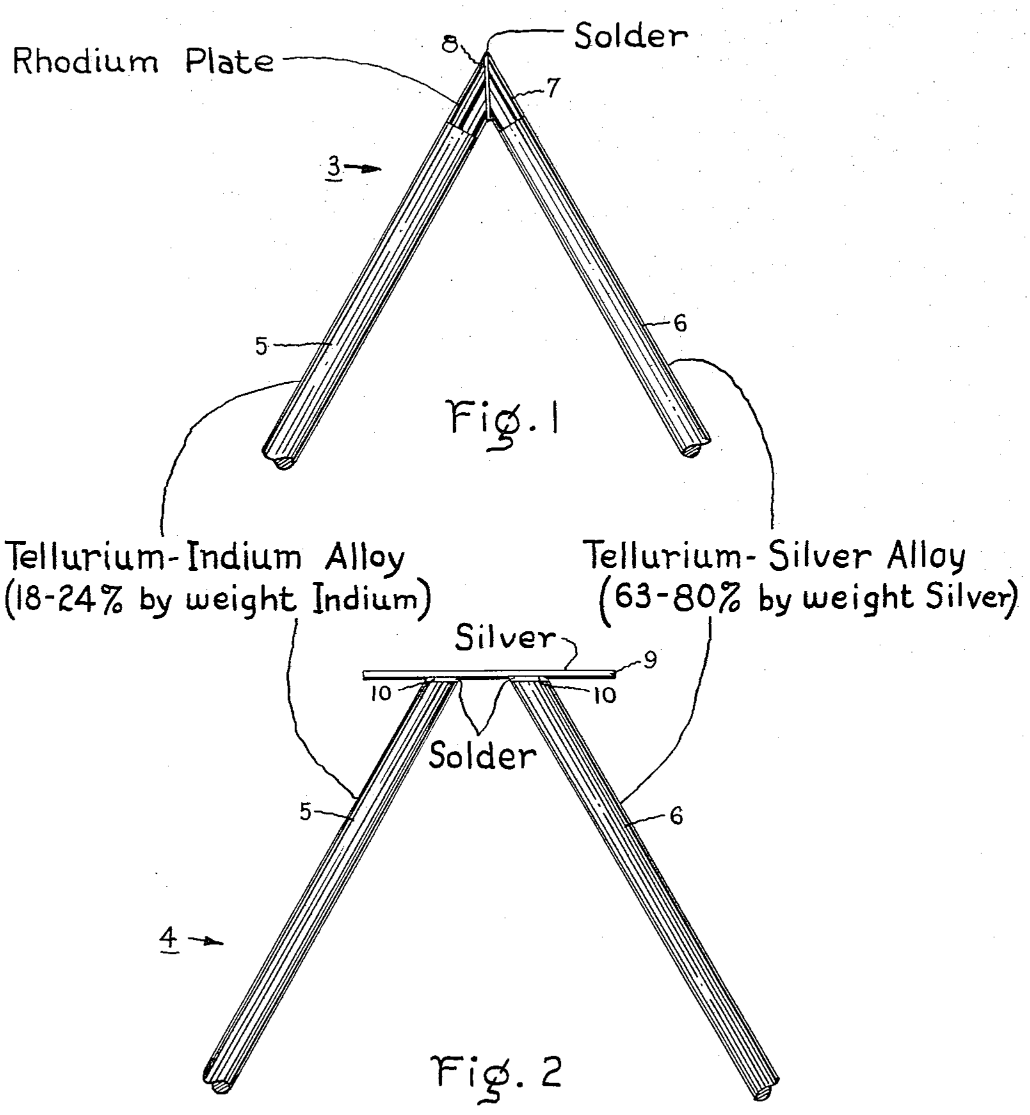

The present invention relates to a novel thermoelectric element and is more particularly concerned with an improved thermocouple comprising such element.

An object of the present invention is to provide a thermoelectric element having a high thermoelectric power, which element is not materially affected by repeated temperature changes.

A further object of the invention is to provide a positive thermoelectric element having a linear temperature-E. M. F. curve.

These objects of the invention and others will become apparent from the following description taken in conjunction with the single sheet of drawings in which:

Figure 1 is a view illustrating one form of a thermocouple constructed in accordance with applicants' invention; and Figure 2 is a view illustrating another form of a thermocouple constructed in accordance with applicants' invention. In accordance with the present invention there is provided a new and improved thermoelectric element composed of tellurium and indium. The elements found to be useful for obtaining the above-mentioned objects are those composed of an alloy containing from about 4 to 28% by weight indium, preferably from about 18 to 24% indium, balance tellurium except for minor impurities such as the traces of copper, magnesium, lead, bismuth and silicon present in commercial tellurium and indium.

The thermoelectric elements in the present invention are characterized specifically by a very high thermal E. M. F. against copper, and thermocouples comprising these elements particularly in combination with elements having a high negative thermal E. M. F. against copper are particularly useful in thermocouple instruments for high frequency measurements, thermal wattmeters, and in radiation pyrometers.

The thermoelectric alloys used in the elements of the present invention are prepared by melting a mixture of indium and tellurium in the desired proportions. These metals are readily soluble in the proportions employed and the molten alloys are cast into a suitable form.

The properties of the tellurium-indium elements vary somewhat with the indium content. For example, the maximum thermal E. M. F. is obtained with an element containing about 22% indium, balance tellurium. All of the alloys containing from 18 to 24% indium have substantially linear thermal E. M. F. curves. A series of thermocouples comprising a copper negative element and positive elements of tellurium containing varying percentages of indium with the hot junction of the thermocouple at +150° C. and the cold junction at 50° C. had E. M. F. outputs of from 30 to 45 millivolts with the maximum output being about 47 millivolts from the thermocouple in which the positive element was composed of tellurium and 22% indium.

The resistivity of the tellurium-indium elements varies with the indium content. It is about 0.4 ohm per $cm.^3$ for the elements containing from 4 to 18% indium. As the indium content is increased from 18% up to 24%, the resistivity increases almost linearly to a maximum of about 1.8 ohms.

The elements containing above 18% indium are therefore best suited for those applications where high millivolts output is required and a low resistance is not important.

While the thermoelectric elements of the present invention can be used with any suitable negative element in the manufacture of thermocouples, high efficient thermocouples are obtained when the tellurium-indium element is used in combination with a second element having a high negative thermal E. M. F. Preferred negative elements are those composed of an alloy of about 58% tellurium and 42% bismuth, and the tellurium-silver elements described in the co-pending application Serial No. 166,073 filed June 3, 1950, now Patent No. 2,602,095 in the name of Harold T. Faus and assigned to the same assignee as the present invention. The tellurium-silver elements contain from 63 to 80% by weight silver, preferably about 65% by weight silver.

Examples of thermocouples utilizing the aforesaid thermoelectric elements are shown in Figures 1 and 2, wherein like reference characters have been used throughout to indicate like parts. Thus, we see two thermocouples 3, 4 comprising identical positive thermoelectric elements 5 respectively and identical negative thermoelectric elements 6 respectively.

As indicated on the drawing, the positive elements 5 comprise a tellurium-indium alloy, there being about 18 to 24 percent by weight of indium and the balance being tellurium. Also indicated in the drawings are the negative elements 6 comprising the aforesaid tellurium-silver alloy, there being about 63 to 80 percent by weight of silver, the balance being tellurium.

The thermocouple shown in Figure 1 has the tips of its positive and negative elements tapered and then electroplated, after which a junction between the two is formed by soldering the plated parts together. The elements are shown plated at 7 will rhodium, and it has been found that a tin-lead solder 8 will make a strong joint at the junction of the elements. Nickel or platinum plating can also be used on the elements in combination with a tin-lead solder.

In Figure 2, there is shown a junction in which the tapered ends of the thermocouple elements are joined to a thin silver disk 9 by a suitable solder 10. Such a junction might be used in the sensing element of a radiation pyrometer, and it has been found that the interposition of a third metal in the form of the silver disk 9 has no effect on the thermal E. M. F. providing the junctions between the disk and the two elements are at the same temperature. In this embodiment, a lead-indium solder has been found suitable to produce strong junctions for the parts.

It is to be understood that the tellurium-indium alloy elements of the present invention, as well as the silver and bismuth alloys of tellurium, will contain the usual impurities present in the commercial grades of these metals, which impurities are normally present in the final alloys.

What I claim as new and desire to secure by Letters Patent of the United States is:

1. A positive thermoelectric element consisting of tellurium and from 4 to 28% by weight indium.

2. A positive thermoelectric element consisting of tellurium and from 18 to 24% by weight indium.

3. A thermocouple comprising a positive element composed of an alloy consisting of tellurium and from 4 to 28% indium.

4. A thermocouple comprising a positive element consisting of tellurium and from 18 to 24% by weight indium.

5. The thermocouple of claim 4 in which the second negative element is an alloy consisting of tellurium, and from 63 to 80% by weight silver.

6. The thermocouple of claim 4, in which the negative element is composed of an alloy of about 58% tellurium and 42% bismuth.

References Cited in the file of this patent

UNITED STATES PATENTS

| | | |
|---|---|---|
| 2,264,073 | Faus | Nov. 25, 1941 |
| 2,588,998 | Troy et al. | Mar. 11, 1952 |

FOREIGN PATENTS

| | | |
|---|---|---|
| 568,901 | Great Britain | Apr. 25, 1945 |

OTHER REFERENCES

"Journal of Applied Physics," December 1947, pages 1123 and 1124.

"Aufban der Zweistofflegierungen," by Hansen, Photo-Lithoprint by Edwards Brothers, Inc., Ann Arbor, Michigan, 1943, pages 826 and 827.

International Critical Elements of Numerical Data, Physics, Chemistry and Technology, vol. 6, 1929, pages 213–218.